(12) United States Patent  (10) Patent No.: US 7,645,669 B2
Hsu et al.  (45) Date of Patent: Jan. 12, 2010

(54) NANOTIP CAPACITOR

(75) Inventors: Sheng Teng Hsu, Camas, WA (US); Fengyan Zhang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 189 days.

(21) Appl. No.: 11/707,712

(22) Filed: Feb. 16, 2007

(65) Prior Publication Data

US 2008/0197399 A1 Aug. 21, 2008

(51) Int. Cl.
*H01L 21/336* (2006.01)
(52) U.S. Cl. .................. 438/257; 438/618; 438/734; 257/296; 257/300
(58) Field of Classification Search .......... 438/257, 438/618, 734; 257/296, 300, 303
See application file for complete search history.

(56) References Cited

U.S. PATENT DOCUMENTS

| | | | |
|---|---|---|---|
| 7,208,372 B2 * | 4/2007 | Hsu et al. .................. 438/257 |
| 7,385,295 B2 * | 6/2008 | Son et al. .................. 257/776 |
| 2002/0182820 A1 * | 12/2002 | Choi et al. ................. 438/396 |
| 2006/0197438 A1 * | 9/2006 | Conley et al. .............. 313/503 |
| 2007/0111430 A1 * | 5/2007 | Chudzik et al. ............ 438/252 |
| 2007/0126079 A1 * | 6/2007 | Shioya et al. .............. 257/532 |
| 2007/0152273 A1 * | 7/2007 | Callegari et al. ........... 257/351 |

* cited by examiner

*Primary Examiner*—Phuc T Dang
(74) *Attorney, Agent, or Firm*—Law Office of Gerald Maliszewski; Gerald Maliszewski

(57) ABSTRACT

A nanotip capacitor and associated fabrication method are provided. The method provides a bottom electrode and grows electrically conductive nanotips overlying the bottom electrode. An electrically insulating dielectric is deposited overlying the nanotips, and an electrically conductive top electrode is deposited overlying dielectric-covered nanotips. Typically, the dielectric is deposited by forming a thin layer of dielectric overlying the nanotips using an atomic layer deposition (ALD) process. In one aspect, the electrically insulating dielectric covering the nanotips forms a three-dimensional interface of dielectric-covered nanotips. Then, the electrically conductive top electrode overlying the dielectric-covered nanotips forms a three-dimensional top electrode interface, matching the first three-dimensional interface of the dielectric-covered nanotips.

17 Claims, 3 Drawing Sheets

NANOTIP CAPACITOR

BACKGROUND OF THE INVENTION

1. Field of the Invention

This invention generally relates to integrated circuit (IC) fabrication and, more particularly, to a nanotip capacitor and a method for fabricating the same.

2. Description of the Related Art

Recently, the fabrication of nanowires has been explored, due to its potential importance as a building block in nano, microelectromechanical (MEM), and nanoelectromechanical NEM device applications. For example, researchers associated with Charles Lieber of Harvard University have reported the synthesis of a variety of semiconductor nanowires made from materials such as silicon (Si), Si-germanium (SiGe), InP, and GaN, for use in building nano-computing system. Other groups have also reported using templates structures to grow metallic nanowires made of materials such as Ni, NiSi, Au, and Pt. Metallic nanowires can be used as interconnections and the sharp tips of the nanowire make them effective for field emission purpose. For example, ZnO nanowires are potentially useful as a light emission element. However, metallic nanowires are fragile, and it is difficult to efficiently fabricate electrical devices from nanowires.

Nanowires can potentially be used in the fabrication of capacitors. There are several methods known to increase the capacitance per unit area of a conventional capacitor electrode. Some methods are: increasing the dielectric constant of the insulator between the electrodes, roughening the electrodes to increase their effective surface area, and using arogel-based supercapacitors. Arogel-based supercapacitors have very large energy storage capability, but the fabrication process is not compatible with conventional silicon (Si) integrated circuit (IC) processes. Additionally, three-dimensional electrodes can be formed, alternately spacing top and bottom electrode fins. However, these structures are difficult to efficiently fabricate.

It would be advantageous if capacitors could be fabricated with nanotip electrodes, forming cost-effective three-dimensional capacitors with ultra high capacitance.

It would be advantageous if the above-mentioned nanotip capacitors could be fabricated in-situ with silicon integrated circuit processes, without additional equipment or chemistry.

SUMMARY OF THE INVENTION

The present invention describes an electronic solid state capacitor which has an ultra-large capacitance per unit area. The capacitor is made with a nanotip electrode, which can be fabricated using conventional Si IC processes.

Accordingly, a method is provided for forming a nanotip capacitor. The method provides a bottom electrode and grows electrically conductive nanotips overlying the bottom electrode. In one aspect, a growth promotion metal is deposited overlying the Si-containing bottom electrode. The growth promotion metal may be a material such as Ti, Ni, Au, Ta, Co, Ir, or Pt. An electrically insulating dielectric is deposited overlying the nanotips, and an electrically conductive top electrode is deposited overlying dielectric-covered nanotips.

The nanotips can be a material such as $IrO_2$, $TiO_2$, InO, ZnO, $SnO_2$, $Sb_2O_3$, $In_2O_3$, carbon, Pd, Pt, Au, Mo, Si, Ge, SiGe, CdSe, AlN, ZnS, InP, InAs, It, In, or Ti. The dielectric is a material such as $HfO_2$, $Al_xHf_{1-x}$, $ZrO_2$, $SiO_2$, $Si_3O_4$, or $Al_2O_3$. The bottom electrode is typically a Si-containing material such as doped Si, doped polycrystalline Si, or doped silicon-germanium (SiGe). The top electrode metal is a metal such as Al, TiN, Pt, Ir, W, or Au.

Typically, the dielectric is deposited by forming a thin layer of dielectric overlying the nanotips using an atomic layer deposition (ALD) process. The top electrode can be formed from a thin layer of top electrode material overlying the dielectric-covered nanotips using an ALD process, followed by a deposition of top electrode material using a chemical vapor deposition (CVD) process. To achieve sufficient capacitance, the nanotips are grown so that they are separated from each other by a distance greater than, or equal to three-times the dielectric thickness.

In one aspect, the electrically insulating dielectric covering the nanotips forms a three-dimensional (3-D) interface of dielectric-covered nanotips. Then, the electrically conductive top electrode overlying the dielectric-covered nanotips forms a 3-D top electrode with a pattern or interface that matches the dielectric-covered nanotips.

Additional details of the above-described method and a nanotip capacitor device are described below.

DETAILED DESCRIPTION

Figure 1A:
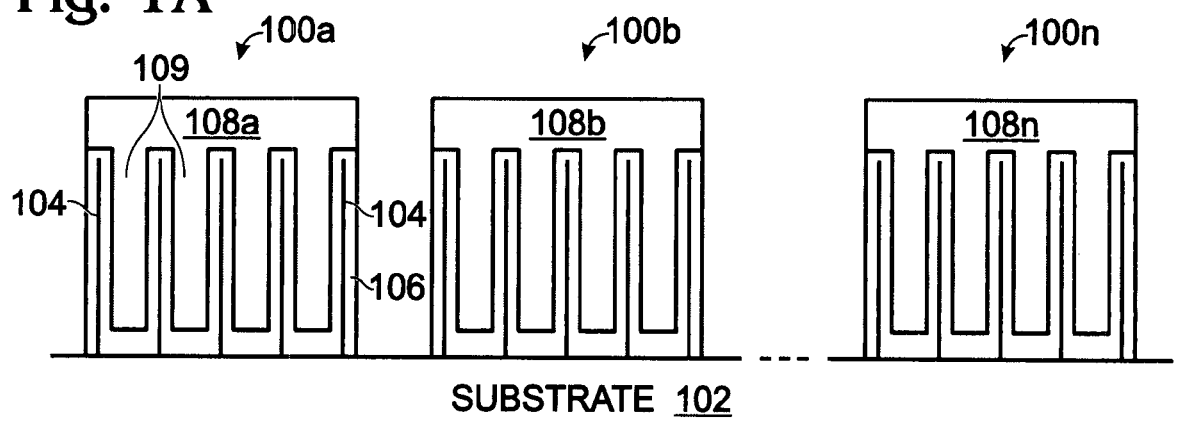
FIGS. 1A and 1B are partial cross-sectional views of a nanotip capacitor.
Figure 1B:
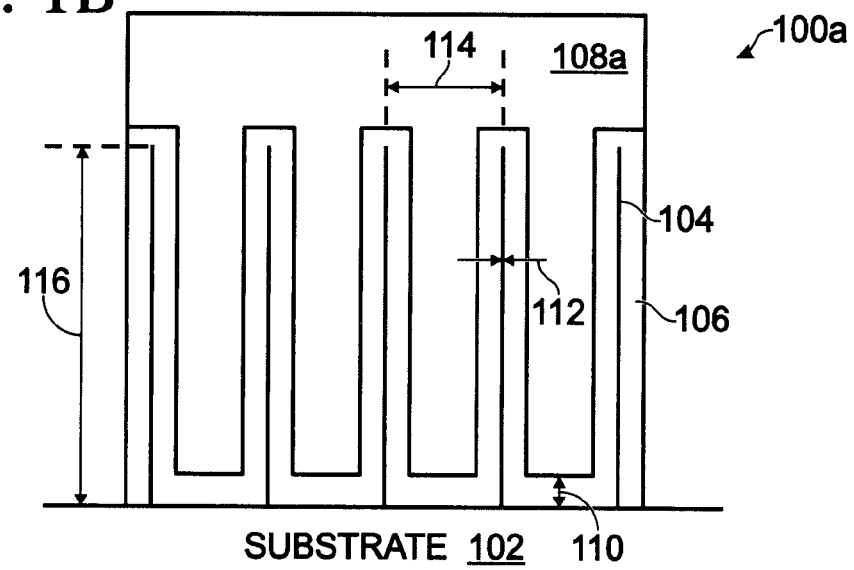

FIGS. 1A and 1B are partial cross-sectional views of a nanotip capacitor. As seen in FIG. 1A, the nanotip capacitor 100 comprises a bottom electrode 102, with electrically conductive nanotips 104 overlying the bottom electrode 102. Alternately, a nanotip 104 may be referred to as a nanorod, nanostructure, nanowire, or nanotube. An electrically insulating dielectric 106 covers the nanotips 104. An electrically conductive top electrode 108 overlies dielectric-covered nanotips 104. Typically, a plurality of isolated nanotip capacitors 110a, 100b, and 100n are formed with isolated top electrodes, 108a, 108b, and 108n, respectively. Although only three capacitors are depicted, the capacitor array is not limited to any particular number. All the nanotips 104 are connected to a common bottom electrode 102. Although shown as part of a capacitor array, the capacitor 100 may be formed as a single discrete element (see FIGS. 2 and 1B).

More explicitly, the dielectric-covered nanotips 104 of each capacitor form a first 3-D interface or pattern of dielectric-covered nanotips, and the top electrode 108 forms a top electrode with a second 3-D interface 109, matching and mating to the first 3-D interface of the dielectric-covered nanotips 104. Alternately stated, the top electrode may be described as a three-dimensional structure that fills the voids between the dielectric-covered nanotips.

It should be noted that "grown" nanotips 104 can be distinguished from nanostructures that are grown on one substrate, "harvested", and then dispersed onto a different substrate. For example, harvested nanowires can be spun-on in a solvent, and the solvent evaporated.

Typically, the nanotips 104 are a material such as $IrO_2$, $TiO_2$, InO, ZnO, $SnO_2$, $Sb_2O_3$, $In_2O_3$, carbon, Pd, Pt, Au, Mo, Si, Ge, SiGe, CdSe, AlN, ZnS, InP, InAs, It, In, or Ti. However, this is not intended to be a list of every possible material.

Further, in addition to simple one-material nanotips, the nanotips 104 may be a core and shell structure made from a combination of two of the above-mentioned materials, or nanoparticle-coated nanotips. For example, Pd particles coating $TiO_2$ nanotips may be employed. The nanotips 104 may have a segmented axis structure, where each segment is made from one of the above-mentioned materials. Further, the nanotips may have a multiple stacked or multi-layer structure, where each layer in the stack is made from one of the above-mentioned materials.

The dielectric 106 may be a material such as $HfO_2$, $Al_xHf_{1-x}$, $ZrO_2$, $SiO_2$, $Si_3O_4$, or $Al_2O_3$. However, other materials are known in the art with similar properties that may also be effective as a dielectric. The bottom electrode 102 is typically a Si-containing material such as silicon-on-insulator (SOI), polycrystalline Si, amorphous Si, single-crystal Si, doped Si, or doped silicon-germanium (SiGe). However, it may also be possible to form the bottom electrode from metals or other conductors. The top electrode metal 108 may be Al, TiN, Pt, Ir, W, or Au. However, the invention may be enabled with other conductive materials.

Figure 2:
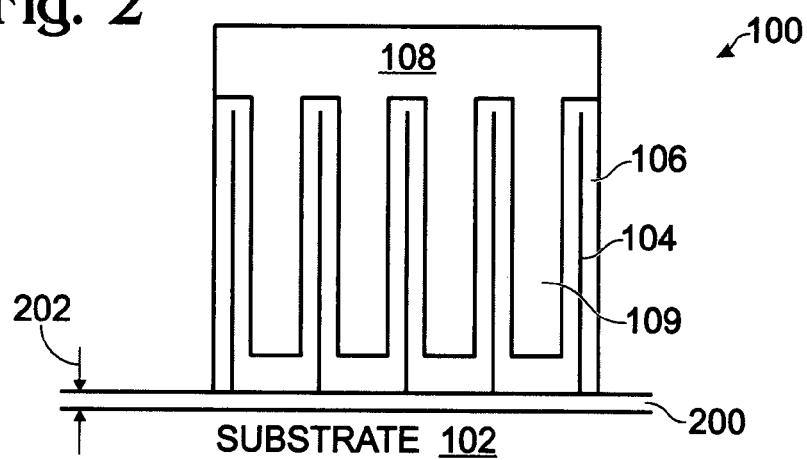
FIG. 2 is a partial cross-sectional view depicting a variation of the nanotip capacitor of FIG. 1A.

FIG. 2 is a partial cross-sectional view depicting a variation of the nanotip capacitor of FIG. 1A. In this aspect, a layer of growth promotion metal 200 overlies the Si-containing bottom electrode 102. Typically, the growth promotion metal 200 is a material such as Ti, Ni, Au, Ta, Co, Ir, or Pt. The growth-promotion metal 200 may have a thickness 202 in a range of about 0.1 to 10 nanometers (nm).

FIG. 1B is a more detailed depiction of nanotip capacitor 100a from FIG. 1A. The dielectric 106 has a dielectric thickness 110. Typically, the nanotips 104 have a cylindrical structure with a diameter 112, and are separated from each other by a distance 114 greater than, or equal to three-times the dielectric thickness 110. In other aspects the nanotips may have a square, triangular, or oval shape. Further, in some aspects not shown, there may be a cavity or hollow region in the center of the core.

For example, the nanotips may have a 2 micrometer (um) height 116 and a 20 nm diameter 112. The dielectric thickness 110 may be 3 nanometers (nm), and the separation 114 between nanotips may be 10 nm. In this case, the nanotip capacitor 100 has 140 times more capacitance than a planner (no nanotips) capacitor having the same planner surface area and the same dielectric material thickness. The thickness of the insulator 110 is determined by the maximum operating voltage of the capacitor, which is equal to the breakdown voltage of the insulator.

Functional Description

The nanotip energy storage element described above is a solid state capacitor. The capacitor is made without arogels, electrolytics, electrochemical double layers, or redox processes. This capacitor can be as an element of an integrated circuit, or be fabricated as a stand-alone discrete capacitor.

A set of nanotips is grown onto a conductive electrode and is coated with a high-k dielectric, followed by the deposition of the top electrode. The nanotips drastically increase the active area of the electrodes per unit planner area. For example, if the nanotip diameter is 100 nm and the nanotips are evenly dispersed on the electrode, then the active capacitor area is 32.4, 63.8, and 95.2 times larger than a conventional planer capacitor having the same electrode planar surface, for nanotips length of 1 μm, 2 μm, and 3 μm, respectively. If the diameter of the nanotips is 10 nm, the effective area is 315, 629, and 943 times larger than that of the conventional planar capacitor for nanotip lengths of 1 μm, 2 μm, and 3 μm, respectively.

Figure 3:
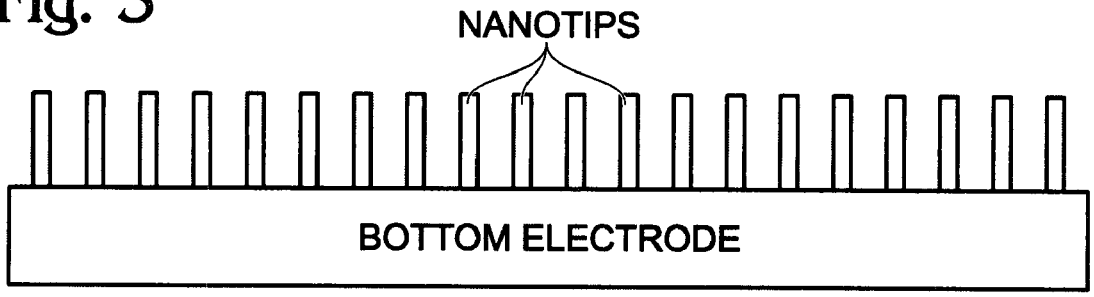
FIGS. 3 through 5 depict steps in the fabrication of a completed nanotip capacitor.
Figure 4:
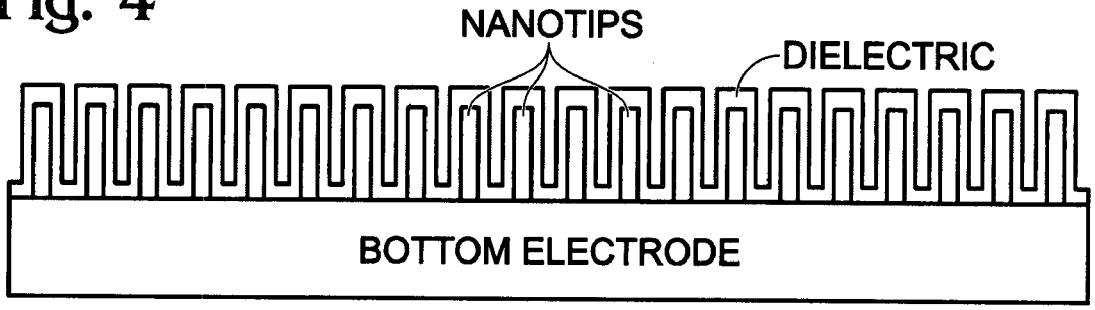
Figure 5:
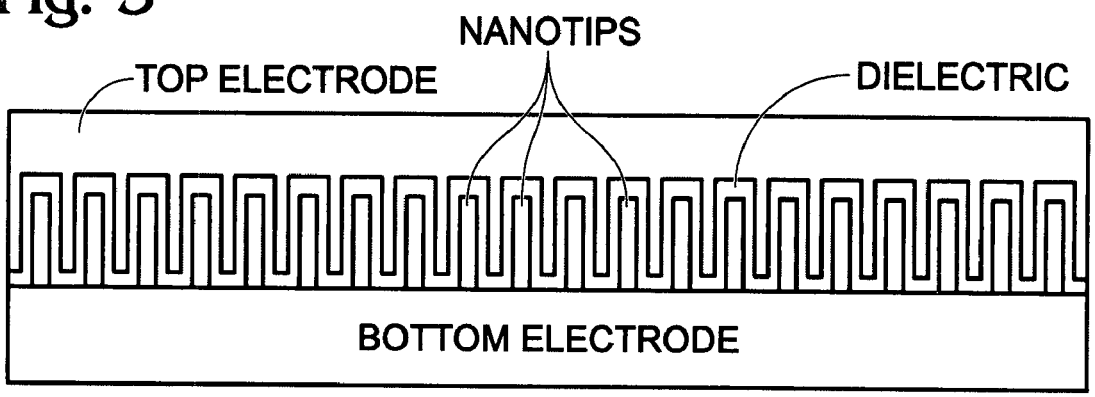

FIGS. 3 through 5 depict steps in the fabrication of a completed nanotip capacitor. The fabrication process of nanotips capacitor is as follows:

1. Prepare the bottom electrode;
2. Grow nanotips. The nanotips may be ZnO, Ir, $IrO_2$, Ti, $TiO_2$, W, $In_2O_3$, C, and other highly conductive material, as shown in FIG. 3. The nanotips do not have to be all vertically oriented. Since all the nanotips are connected to the bottom electrode, they may be cross over or even touch to each other. Preferably, the nanotips are sufficiently separated so that the metal of the top electrode is in contact with each of the nanotips, to maximize the effective area of the capacitor.
3. Deposit a high-k dielectric. Although a CVD process may be used, preferably an atomic layer deposition (ALD) process is used, since it can deposit a very uniform, very thin layer of insulator. The dielectric can be $HfO_2$, $Al_xHf_{1-x}O_2$, or $ZrO_2$. Materials such as $SiO_2$, $Si_3O_4$, $Al_2O_3$, and other known insulators may also be used, as shown in FIG. 4.
4. Deposit the top electrode. Again, it is preferred that a thin layer be deposited by ALD, followed by a conventional CVD process for a thicker top electrode metal.
5. Photoresist and etch, to form capacitors of the desired size, see FIG. 5.

Figure 6:
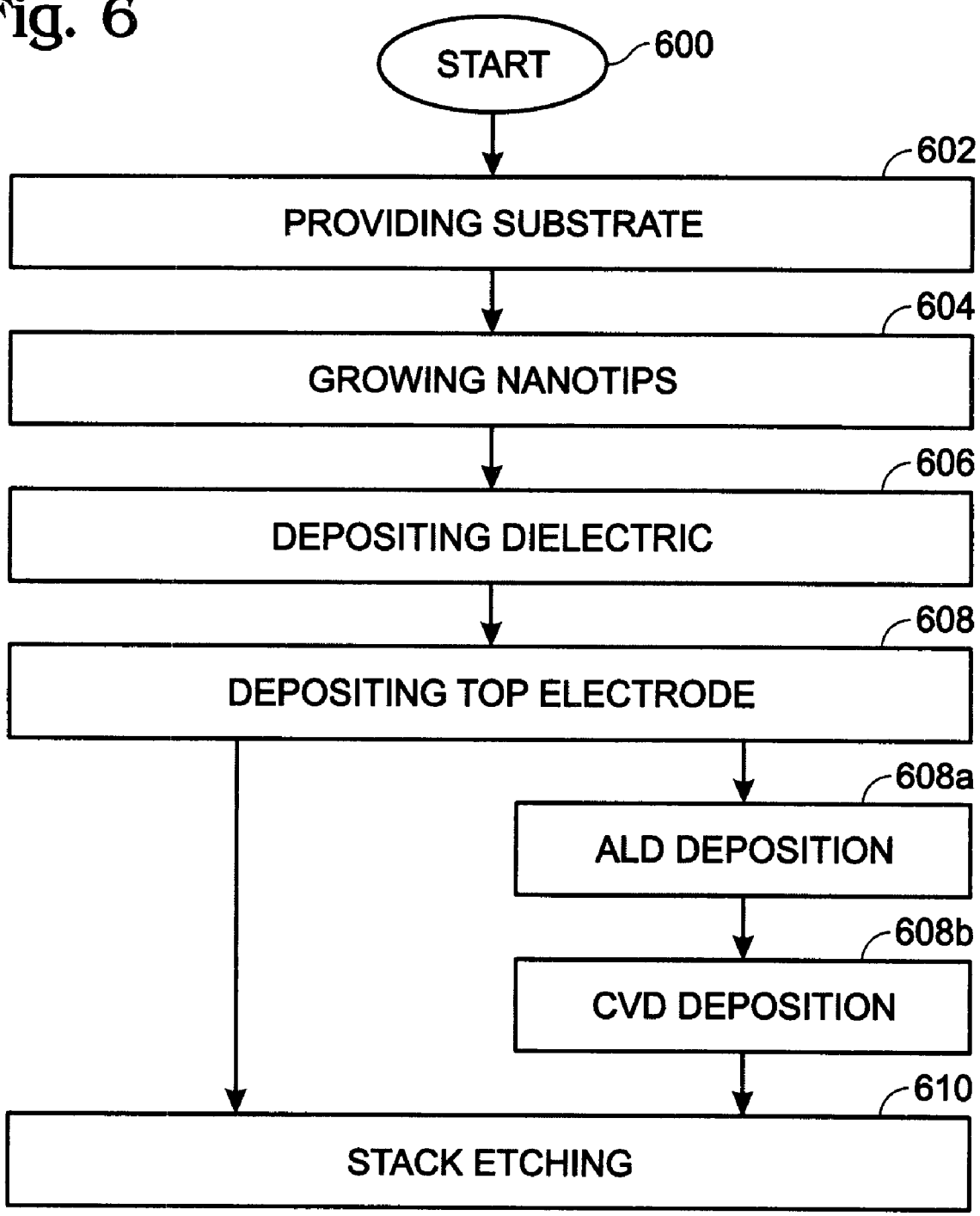
FIG. 6 is a flowchart illustrating a method for forming a nanotip capacitor.

FIG. 6 is a flowchart illustrating a method for forming a nanotip capacitor. Although the method is depicted as a sequence of numbered steps for clarity, no order need necessarily be inferred from the numbering. It should be understood that some of these steps may be skipped, performed in parallel, or performed without the requirement of maintaining a strict order of sequence. The method starts at Step 600.

Step 602 provides a bottom electrode by any conventional process. For example, the bottom electrode may be a Si-containing material such as SOI, polycrystalline Si, amorphous Si, single-crystal Si, doped Si, or doped SiGe. Step 604 grows electrically conductive nanotips overlying the bottom electrode. For example, the nanotips may be a material such as $IrO_2$, $TiO_2$, InO, ZnO, $SnO_2$, $Sb_2O_3$, $In_2O_3$, carbon, Pd, Pt, Au, Mo, Si, Ge, SiGe, CdSe, AlN, ZnS, InP, InAs, It, In, or Ti. In one aspect, the electrically conductive nanotips are grown by depositing a growth promotion metal overlying the Si-containing bottom electrode. The growth promotion metal may be a material such as Ti, Ni, Au, Ta, Co, Ir, or Pt.

Step 606 deposits an electrically insulating dielectric overlying the nanotips. For example, the dielectric includes may be a material such as $HfO_2$, $Al_xHf_{1-x}$, $ZrO_2$, $SiO_2$, $Si_3O_4$, or $Al_2O_3$. Step 608 deposits an electrically conductive top electrode overlying dielectric-covered nanotips. For example, the top electrode metal may be a material such as Al, TiN, Pt, Ir, W, or Au. In one aspect, Step 610 selectively stack etches through the bottom electrode, forming a plurality of isolated nanotip capacitors.

In another aspect, Step 606 deposits a dielectric with a dielectric thickness, and Step 604 grows nanotips separated from each other by a distance greater than, or equal to three-times the dielectric thickness.

In a different aspect, Step 606 deposits the dielectric by forming a thin layer of dielectric overlying the nanotips using an ALD process. Likewise, Step 608 deposits the top electrode using the following substeps. Step 608a forms a thin layer of top electrode material overlying the dielectric-covered nanotips using an ALD process. Subsequent to the ALD process, Step 608b conformally deposits top electrode material using a CVD process.

In one aspect, depositing the electrically insulating dielectric overlying the nanotips in Step 606 includes forming a first 3-D interface of dielectric-covered nanotips. Then, depositing the electrically conductive top electrode overlying dielectric-covered nanotips in Step 608 includes forming a top electrode with a second 3-D interface, matching the first 3-D interface of the dielectric-covered nanotips.

A nanotip capacitor and an associated fabrication method have been provided. A few examples of process specifics and materials have used to illustrate the invention. However, the invention is not limited to just these examples. Other variations and embodiments of the invention will occur to those skilled in the art.

We claim:

1. A method for forming a nanotip capacitor, the method comprising:
   providing a bottom electrode from a Si-containing material selected from a group consisting of silicon-on-insulator (SOI), polycrystalline Si, amorphous Si, single-crystal Si, doped Si, and doped silicon-germanium (SiGe);
   depositing a growth promotion metal overlying the Si-containing bottom electrode, the growth promotion metal selected from a group of materials consisting of Ti, Ni, Au, Ta, Co, Ir, and Pt;
   growing electrically conductive nanotips overlying the bottom electrode;
   depositing an electrically insulating dielectric overlying and completely covering the nanotips, wherein the dielectric is a material selected from a group consisting of $HfO_2$, $Al_xHf_{1-x}$, $ZrO_2$, $SiO_2$, and $Al_2O_3$; and,
   depositing an electrically conductive top electrode overlying dielectric-covered nanotips.

2. The method of claim 1 wherein growing nanotips includes growing nanotips from a material selected from a group consisting of $IrO_2$, $TiO_2$, InO, ZnO, $SnO_2$, $Sb_2O_3$, $In_2O_3$, carbon, Pd, Pt, Au, Mo, Si, Ge, SiGe, CdSe, AlN, ZnS, InP, InAs, It, In, and Ti.

3. The method of claim 1 wherein depositing the top electrode metal includes depositing a metal selected from a group consisting of Al, TiN, Pt, Ir, W, and Au.

4. The method of claim 1 wherein depositing the dielectric includes depositing a dielectric with a dielectric thickness; and,
   wherein growing the nanotips includes growing nanotips separated from each other by a distance greater than, or equal to three-times the dielectric thickness.

5. The method of claim 1 wherein depositing the dielectric includes forming a thin layer of dielectric overlying the nanotips using an atomic layer deposition (ALD) process.

6. The method of claim 1 wherein depositing the top electrode includes:
   forming a thin layer of top electrode material overlying the dielectric-covered nanotips using an ALD process; and,
   subsequent to the AID process, conformally depositing top electrode material using a chemical vapor deposition (CVD) process.

7. The method of claim 1 further comprising:
   selectively stack etching through the bottom electrode, forming a plurality of isolated nanotip capacitors.

8. The method of claim 1 wherein depositing the electrically insulating dielectric overlying the nanotips includes forming a first three-dimensional (3-D) interface of dielectric-covered nanotips; and,
   wherein depositing the electrically conductive top electrode overlying dielectric-covered nanotips includes forming the top electrode in a second 3-D interface, matching the first 3-D interface.

9. A nanotip capacitor comprising:
   a bottom electrode;
   electrically conductive nanotips overlying the bottom electrode;
   an electrically insulating dielectric having a thickness, completely covering the nanotips; and,
   an electrically conductive top electrode overlying dielectric-covered nanotips;
   wherein the nanotips have a cylindrical structure with a first diameter and are separated from each other by a distance greater than, or equal to three-times the dielectric thickness; and,
   wherein the dielectric is a material selected from a group consisting of $HfO_2$, $Al_xHf_{1-x}$, $ZrO_2$, $SiO_2$, and $Al_2O_3$.

10. The nanotip capacitor of claim 9 wherein the nanotips are a material selected from a group consisting of $IrO_2$, $TiO_2$, InO, ZnO, $SnO_2$, $Sb_2O_3$, $In_2O_3$, carbon, Pd, Pt, Au, Mo, Si, Ge, SiGe, CdSe, AlN, ZnS, InP, InAs, It, In, and Ti.

11. The nanotip capacitor of claim 9 wherein the bottom electrode is a Si-containing material selected from a group consisting of silicon-on-insulator (SOI), polycrystalline Si, amorphous Si, single-crystal Si, doped Si, and doped silicon-germanium (SiGe).

12. The nanotip capacitor of claim 11 further comprising:
    a layer of growth promotion metal overlying the Si-containing bottom electrode, the growth promotion metal selected from a group of materials consisting of Ti, Ni, Au, Ta, Co, Ir, and Pt.

13. The nanotip capacitor of claim 9 wherein the top electrode metal is a metal selected from a group consisting of Al, TiN, Pt, Ir, W, and Au.

14. The nanotip capacitor of claim 9 further comprising:
    a plurality of isolated nanotip capacitors with isolated top electrodes, with nanotips connected to a common bottom electrode.

15. The nanotip capacitor of claim 9 wherein the dielectric-covered nanotips form a first three-dimensional (3-D) interface of dielectric-covered nanotips; and,
    wherein the top electrode forms a top electrode with a second 3-D interface, matching the first 3-D interface.

16. A plurality of nanotip capacitors comprising:
    a common bottom electrode;
    electrically conductive nanotips overlying the common bottom electrode;
    an electrically insulating dielectric completely covering the nanotips; and,
    for each nanotip capacitor, an isolated electrically conductive top electrode overlying dielectric-covered nanotips; and,
    wherein the dielectric is a material selected from a group consisting of $HfO_2$, $Al_xHf_{1-x}$, $ZrO_2$, $SiO_2$, and $Al_2O_3$.

17. A nanotip capacitor comprising:
    a bottom electrode;
    electrically conductive nanotips overlying the bottom electrode;
    an electrically insulating dielectric completely covering the nanotips; and,
    an electrically conductive top electrode overlying dielectric-covered nanotips;
    wherein the dielectric is a material selected from a group consisting of $HfO_2$, $Al_xHf_{1-x}$, $ZrO_2$, $SiO_2$, and $Al_2O_3$;
    wherein the dielectric-covered nanotips form a first three-dimensional (3-D) interface of dielectric-covered nanotips; and,
    wherein the top electrode forms a top electrode with a second 3-D interface, matching the first 3-D interface.

* * * * *